United States Patent [19]

Kneip, Jr. et al.

[11] 4,164,777
[45] Aug. 14, 1979

[54] SUPERCONDUCTING SWITCH INCORPORATING A STEERING DIODE

[75] Inventors: George D. Kneip, Jr., Menlo Park; Marvin H. Anderson, Mountain View; Robert E. Gang, Sunnyvale, all of Calif.

[73] Assignee: Varian Associates, Inc., Palo Alto, Calif.

[21] Appl. No.: 879,294

[22] Filed: Feb. 21, 1978

[51] Int. Cl.$^2$ .......................... H01H 1/02; H01H 1/62
[52] U.S. Cl. ..................................... 361/331; 307/245; 338/32 S; 200/329; 200/262
[58] Field of Search .......... 361/19, 331, 332, 379–381, 361/385; 335/216; 338/32 S; 307/245, 306; 200/289, 329, 262

[56] References Cited
U.S. PATENT DOCUMENTS

| | | | |
|---|---|---|---|
| 3,054,978 | 9/1962 | Schmidlin | 338/325 |
| 3,202,836 | 8/1965 | Nyberg | 307/245 |
| 3,732,438 | 5/1973 | Wright, Jr. | 307/306 |
| 4,074,343 | 2/1978 | Chaussy | 307/245 |

Primary Examiner—Gerald P. Tolin
Attorney, Agent, or Firm—Stanley Z. Cole; Edward H. Berkowitz

[57] ABSTRACT

A persistence switch comprises a diode and superconductive wire in thermal contact with the diode. The heat evolved by current through the forward biased diode raises the temperature of the superconductor above the transition temperature. The diode characteristic of the switch permits a plurality of such switches to be arranged in a network for selection by a relatively few signal conductors.

5 Claims, 2 Drawing Figures

SUPERCONDUCTING SWITCH INCORPORATING A STEERING DIODE

BACKGROUND OF THE INVENTION

This invention relates to superconducting devices and particularly to persistence switches for effecting transitions between persistent and non-persistent modes for superconducting circuits.

Transitions between persistent and non-persistent (driven) mode for a superconducting circuit are controlled by a persistence switch. Such a device is ordinarily known in the art to comprise a four terminal switching means akin to a monostable relay. In a common form of prior art persistence switch, a signal is supplied to two (input) terminals to drive a resistive heating element. The heat evolved thereby destroys the superconductive state of a superconducting wire which wire forms the remaining two (output) terminals of the switch. When the heating element is de-energized, the liquid helium within the cryostat quickly cools the superconducting wire below the transition point thereby re-establishing the superconductive state.

The input signals for a persistence switch communicate over conductors between the interior and exterior of the cryostat thereby forming a thermal path to the interior of the cryostat with deleterious effects upon the boil-off rate of the coolant therein (liquid helium). Even though such conductors are removed, additional heat losses are engendered by the conduit through which such conductors are introduced. In one method for reducing this contribution to the boil-off rate, the number of control conductors serving a plurality of p persistence switches is minimized by arrangement of such persistence switches in a communicating array. Each persistence switch in the array incorporates a diode in series with the switch heating element. A steering network is thereby achieved whereby any desired one of the persistence switches may be selected by exciting an appropriate pair of signal conductors leading from the exterior of the cryostat. This forms the subject matter of co-pending U.S. Pat. application Ser. No. 879,293 assigned to the assignee of the present invention.

In the present invention the heat evolved by a diode is employed to destroy the superconducting state of a superconducting wire in thermal contact therewith. No separate heating element is employed.

The object of the present invention is a novel persistence switch for use with an arrangement of similar such switches.

One feature of the present invention is a persistence switch having the characteristics of a diode whereby networks formed by a plurality p of such switches may be accommodated with a number n of actuating signal conductors such that n is less than p.

Another feature of the present invention is the utilization of the heat evolved by a forward biased diode to effect transitions in the superconducting state of a superconductor in thermal contact therewith.

Other features and advantages of the present invention will become apparent upon a perusal of the following specification taken in connection with the accompanying drawings.

DETAILED DESCRIPTION OF THE PREFERRED EMBODIMENT

Figure 1:
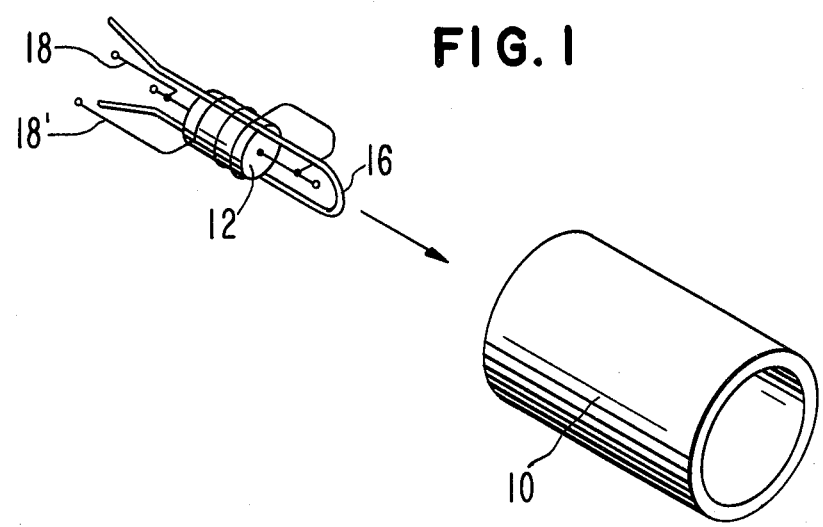
FIG. 1 is an illustration of the present invention in projection.

Referring now to FIG. 1, there is shown in projection an embodiment of the persistence switch of the present invention. An insulating sleeve 10 forms the housing within which a diode 12 is mounted. For purposes of clarity the sleeve 10 is here shown removed. The mounting is accomplished by filling the entire housing 10 with an epoxy resin 14 (not shown), or alternatively by filling the end portions of the housing 10 encompassing the end portions of the diode 12, securing the diode 12 thereby.

A loop of superconducting wire 16 is held in thermal contact with the diode 12 by several turns of manganin wire 18. Manganin wire is preferred for its low thermal conductivity relative to the copper leads of diode 12. Other equivalently low thermal conductivity wires would serve as well. In a preferred embodiment the manganin wire 18 securing the superconductor to diode 12 is also used as a lead from one terminal of the diode 12. Another manganin wire 18' is used to form the remaining lead from the diode 12: the manganin leads 18, 18' to the diode 12 have been found useful in reducing the heat loss from the diode 12 to the surrounding helium bath along the diode leads.

Figure 2:
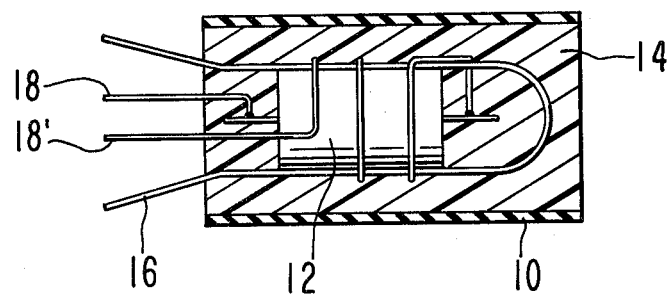
FIG. 2 is a schematic illustration of the apparatus of FIG. 1 in section.

The apparatus of FIG. 1 is displayed in section in FIG. 2.

A 1N5817 Schottky diode has been used as the heating element for the preferred embodiment, although small silicon or germanium diodes could alternatively be used in place of the Schottky diode. However, such alternative silicon or germanium diodes would exhibit much higher turn-on voltages at liquid helium temperatures (4.2° K.).

The epoxy potting compound which has been employed is Emerson and Cumming, Stycast 1090—Catalyst 9. No doubt other such materials would prove suitable for this purpose.

The driving signal for the persistence switch of the present invention is a constant voltage source of about 1.4 volts in series with current limiting resistor of about 10 ohms. However, a constant current source could also be used. A voltage drop of 0.8 V is characteristic of the Schottky diode above: thus, 60 ma. is drawn when the diode is forward biased.

Since many changes can be made in the above construction, many apparently widely differing embodiments of this invention can be made without departing from the scope thereof. It is intended that all matter contained in the above description or shown in the accompanying drawings shall be interpreted as illustrative and not in a limiting sense.

What is claimed is:

1. A persistence switch for effecting the transition between persistent and non-persistent modes in a superconducting circuit comprising
   a diode having leads,
   a superconductive material disposed in thermal contact with said diode, said material forming two superconductive leads of said switch, and two other leads connected to the respective leads of said diode, said other leads formed of a material exhibiting lower thermal conductivity than the leads of said diode.

2. The apparatus of claim 1 wherein the material forming said other leads is manganin.

3. The apparatus of claim 1 wherein at least one of said other leads secures said superconductive material in thermal contact with said diode.

4. The apparatus of claim 1 wherein said swtich is housed within an insulating sleeve and said sleeve is sealed.

5. The apparatus of claim 4 wherein the interior of said housing formed from said insulating sleeve is filled with an epoxy resin.

* * * * *